United States Patent [19]

Nederlof

[11] Patent Number: 5,412,503
[45] Date of Patent: May 2, 1995

[54] SPECIMEN HOLDER FOR A PARTICLE BEAM OPTICAL APPARATUS

[75] Inventor: Frank Nederlof, Eindhoven, Netherlands

[73] Assignee: U.S. Philips Corporation, New York, N.Y.

[21] Appl. No.: 110,597

[22] Filed: Aug. 23, 1993

[30] Foreign Application Priority Data

Aug. 27, 1992 [EP] European Pat. Off. ............ 92202609

[51] Int. Cl.⁶ .................... G02B 21/26; G21K 5/10
[52] U.S. Cl. ................... 359/393; 359/391; 250/442.11
[58] Field of Search ................ 359/391–396; 250/440.11, 441.12, 442.12, 497.11, 311

[56] References Cited

U.S. PATENT DOCUMENTS

| | | | |
|---|---|---|---|
| 2,602,899 | 7/1952 | Page | 250/441.11 |
| 4,101,778 | 7/1978 | Von Rauch et al. | 250/442.11 |
| 4,587,431 | 5/1986 | Demura | 250/442.11 |
| 4,771,178 | 9/1988 | Egle et al. | 250/442.11 |

FOREIGN PATENT DOCUMENTS

| | | |
|---|---|---|
| 0423877 | 4/1991 | European Pat. Off. |
| 2542351 | 3/1977 | Germany |
| 3546095 | 6/1987 | Germany |

Primary Examiner—Loha Ben
Assistant Examiner—Thong Nguyen
Attorney, Agent, or Firm—Leroy Eason

[57] ABSTRACT

A specimen holder for use in a particle beam optical apparatus, for example an electron microscope. The motions of the specimen in orthogonal Z and Y directions are realized in known manner by motions of a tubular housing in a ball joint. In order to achieve a defined and reproducible motion of the specimen in the x-direction, a rod-shaped specimen support is supported in V-grooves in the housing. The specimen support is connected to a cylindrical flange member which is coupled to the housing via a bellows, providing a vacuum passage which is static for the x-motion. Static vacuum sealing is provided by an O-ring.

3 Claims, 2 Drawing Sheets

5,412,503

SPECIMEN HOLDER FOR A PARTICLE BEAM OPTICAL APPARATUS

BACKGROUND OF THE INVENTION

1. Field of the Invention

The invention relates to a particle beam optical apparatus with a specimen holder which comprises a housing which is movable relative to the apparatus in first and second, mutually perpendicular directions, and a rod-shaped specimen support for supporting the specimen, which support is accommodated in the tubular housing and is movable in a third direction perpendicularly to the first and the second directions, said specimen support being supported, at the end thereof facing the optical axis of the apparatus, in a V-groove whose groove direction is the third direction.

The invention also relates to a specimen holder for such a particle beam optical apparatus.

2. Description of the Related Art

A specimen support of this kind is known from German Offenlegungsschrift (published Patent Application) DE 35 46 095.

Generally speaking, specimen supports must be capable of moving the specimen in three directions: the direction of the particle beam (the z-axis), the direction of the axis of the specimen support of the specimen holder (the x-axis), and the direction perpendicular to said two axes (the y-axis).

In the cited Patent Appliction the motions in the y-direction and the z-direction are realised by tilting the housing about a ball joint forming part of the housing. Because the axis of this tilt is situated outside the optical axis of the particle beam optical instrument (and hence outside the specimen), this tilt causes a displacement of the specimen in the y-direction and/or the z-direction. In this specimen holder it is also possible to rotate the specimen about the x-axis. To this end, the drive for this rotation is connected to the exterior of the housing via a bellows. The object is to achieve a torsion-resistant transmission which does not impede said tilting motions.

The displacement of the specimen support in the x-direction is guided by a V-groove in the ball forming pan of the ball joint. For displacement in the x-direction there is provided a specimen support displacement device which operates against the ambient air pressure acting on the specimen support. The cited Patent Application does not disclose how the vacuum seal between the specimen support and the housing is realised. Generally speaking, this type of seal is customarily realised by means of an O-ring between the specimen support and the housing. For accurately defined and accurately reproducible displacements, O-rings have some drawbacks: some force is required to overcome the initial friction at the start of motion of the O-ring and the material of the O-ring always exhibits some relaxation, so that the initial x-position of the specimen support is lost.

SUMMARY OF THE INVENTION

It is an object of the invention to provide a particle beam optical apparatus with a specimen holder in which the x-positioning of the specimen is defined in a more accurate and more reproducible manner. To achieve this, the apparatus in accordance with the invention is characterized in that the specimen support is connected to the housing via a bellows.

The effect of this is that the vacuum sealing is thus independent of the x-displacement. Vacuum sealing can therefore be realised in any known manner, for example by means of an O-ring.

A further improvement of the positioning of the specimen is achieved in that the other end of the specimen support is supported in a further V-groove. It is thus achieved that any parasitic forces (being forces acting in a direction other than the desired direction) will cause substantially smaller parasitic displacements.

In contemporary particle beam optical apparatus, such as high-resolution electronmicroscopes, one end of the specimen support is often loaded by a variety of additional equipment which substantially contributes to the force exerted on the V-groove by the other end of the specimen support. The friction experienced by the specimen support upon displacement in the x-direction can be further reduced in accordance with the invention in that the further V-groove is constructed as a V-roller.

A further refinement of the x-motion can be achieved by providing a differential gear between the drive mechanism for the x-displacement, if any, and the specimen support. The occurrence of parasitic forces is thus strongly reduced, so that parasitic displacements are reduced even further.

BRIEF DESCRIPTION OF THE DRAWINGS

The invention will be described in detail hereinafter with reference to the Figures. Therein.

DESCRIPTION OF THE PREFERRED EMBODIMENT

Figure 1:
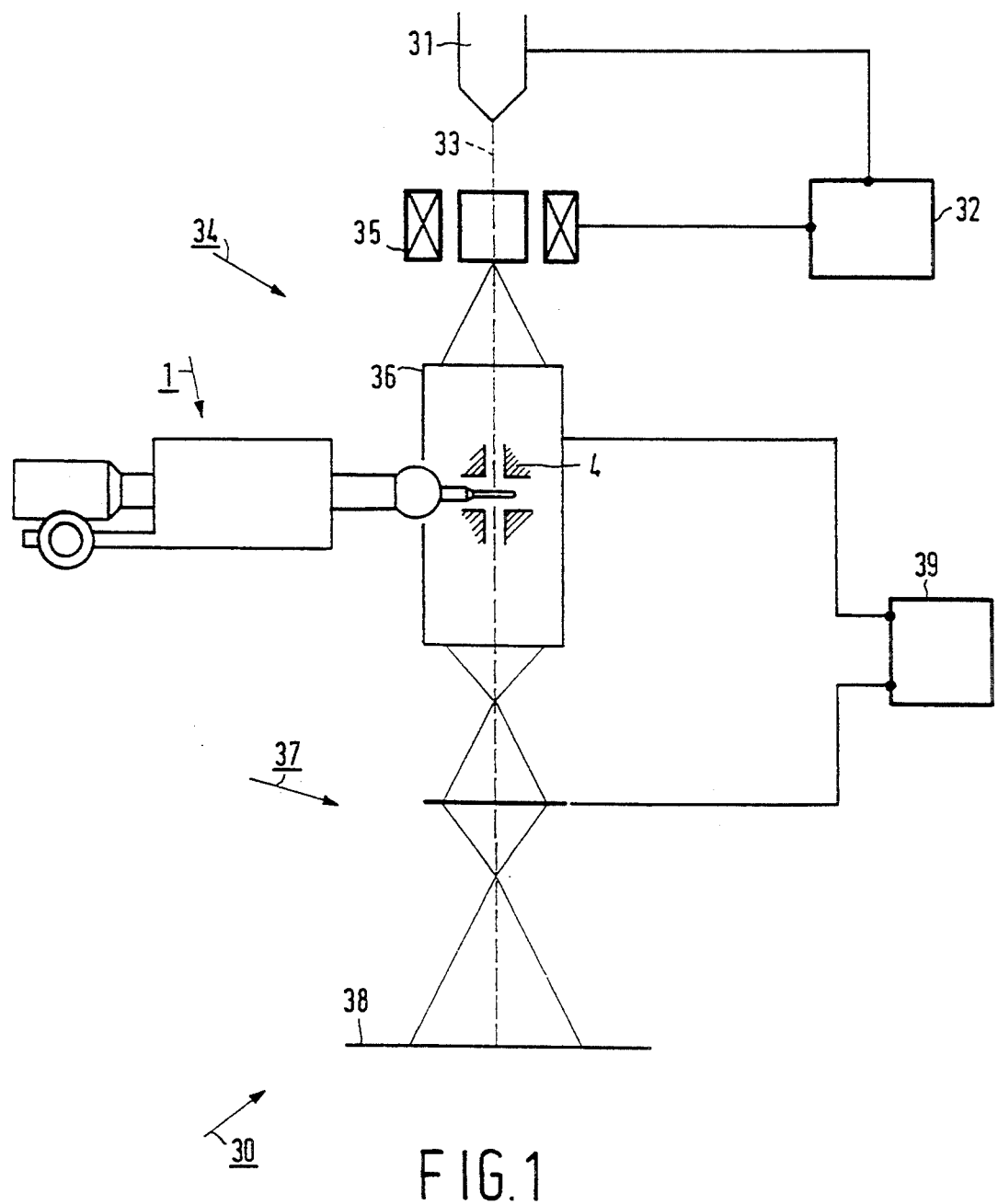
FIG. 1 shows diagrammatically a particle beam optical apparatus in accordance with the invention.

The particle beam optical apparatus 30 diagrammatically shown in FIG. 1 comprises an electron source 31 which is driven by a high-voltage generator 32 so as to generate an electron beam 33, and also comprises an electron-optical system 34 for directing the beam 33 onto an object arranged in a specimen holder 1. The electron-optical system is composed of a condenser system 35 and an objective lens 36 whose poles 4 are diagrammatically indicated. After their passage through the object, the electrons are imaged on an image plane 38 by the objective lens and a further lens system 37. The lenses are energized by a lens power supply 39.

Figure 2:
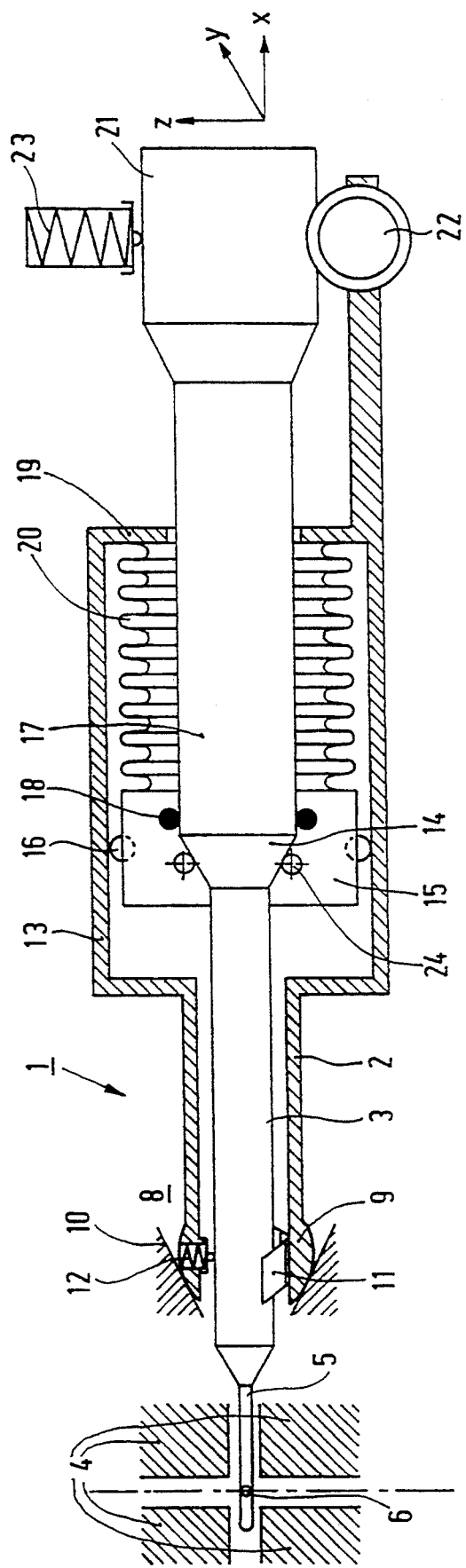
FIG. 2 is a sectional view of the specimen holder to be used in the particle beam optical apparatus shown in FIG. 1.

FIG. 2 shows a specimen holder 1 which consists essentially of a housing 2 and a specimen support 3 accommodated within the housing. An end 5 of the specimen support supports the specimen 6 which is thus positioned between the poles 4 of the particle lens of the particle-optical apparatus. The x, the y and the z-direction in which the specimen is to be movable are shown to the fight of the specimen holder in the Figure. Displacement of the specimen in the z-direction and the y-direction is possible in that the housing 2 is provided with a ball joint 8 which is formed by a ball 9 arranged in a cavity formed by the conical surface 10. This conical surface is rigidly connected to the particle-optical system. When the housing is moved, in the plane of drawing, about the center of the ball joint, a displacement in the z-direction takes place. The same holds for the y-direction when the housing is moved perpendicularly to the plane of drawing.

Within the ball 9 of the ball joint 8 the specimen support is supported in a V-groove 11; this V-groove is formed, for example by two polished surfaces forming part of the interior of the ball 9. The specimen support 3 is positioned in the V-groove in a play-free manner by means of a pressure spring 12.

The mechanism for the x-motion and the vacuum passage are provided in a widened portion 13 of the housing 2. Around a conical thickened portion 14 of the specimen support 3 there is provided a cylindrical flange 15. Via a guide 16, for example ball bearings, the flange can reciprocate in the x-direction. Between the flange 15 and the thickened portion 17 of the specimen support 3 there is provided an O-ring 18 for vacuum sealing. Between the flange 15 and an outwards directed edge 19 of the housing 2 there is provided an airtight bellows 20. The bellows enables displacement of the specimen support 3 in the x-direction, without the specimen support necessarily rubbing against a vacuum seal.

The rear side 21 of the specimen support 3 is supported on a V-roller 22 which is rigidly connected to the housing 2. The rear side 21 is pressed into the V-roller 22 by a pressure spring 23 which is connected to the housing 2 in a manner not shown in the Figure.

In the cylindrical flange 15 there are provided bores which are situated to both sides of the conical thickened portion 14. Round pins 24 are provided in these bores so that the surface of the pins bears on the conical surface of the thickened portion 14. The tensile force in the x-direction is thus transmitted to the specimen support 3 of the specimen holder.

I claim:

1. A specimen holder for supporting and positioning a specimen in a beam path of a particle beam apparatus, comprising:

a housing which is movable relative to the beam path in both a first and a second mutually perpendicular direction, a first end of said housing facing the beam path and a second end thereof facing away from the beam path;

a rod-shaped support for said specimen extending within said housing in a third direction perpendicular to said first and second directions and which is movable in said third direction;

said specimen support having (i) a first end portion which extends into the beam path, (ii) a first intermediate portion adjoining the first end portion and which extends through the first end of said housing and is supported in a V-groove therein, (iii) a second intermediate portion which extends through the second end of said housing, and (iv) a conical transition portion between said first and second intermediate portions;

a cylindrical member which is internally flanged to engage said conical transition portion of said specimen support, and which is supported within said housing so as to be movable therein in said third direction; and an airtight bellows within said housing, one end thereof being affixed to said cylindrical member and an opposite end thereof being affixed to the second end of said housing, said bellows enveloping the second intermediate portion of said specimen support between said cylindrical member and the second end of said housing;

whereby movement of said cylindrical member in said third direction causes movement of said specimen support in such direction, without affecting airtight sealing provided by said bellows between said housing and the second intermediate portion of said specimen support.

2. A specimen holder as claimed in claim 1, further comprising a V-grooved member outside the second end of said housing for engaging and supporting the second end portion of said specimen support.

3. A specimen holder as claimed in claim 2, wherein said V-grooved member is a V-roller.

* * * * *